United States Patent
Iwakaji et al.

(10) Patent No.: US 8,558,354 B2
(45) Date of Patent: Oct. 15, 2013

(54) SEMICONDUCTOR DEVICE AND METHOD FOR MANUFACTURING THE SAME

(75) Inventors: Yoko Iwakaji, Kanagawa-ken (JP); Jun Hirota, Kanagawa-ken (JP); Moto Yabuki, Tokyo (JP); Wakana Kai, Kanagawa-ken (JP); Hirokazu Ishida, Kanagawa-ken (JP); Ichiro Mizushima, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 186 days.

(21) Appl. No.: 13/052,143

(22) Filed: Mar. 21, 2011

(65) Prior Publication Data
US 2012/0091414 A1    Apr. 19, 2012

(30) Foreign Application Priority Data
Oct. 14, 2010   (JP) .................................. 2010-231911

(51) Int. Cl.
    *H01L 29/04*    (2006.01)
(52) U.S. Cl.
    USPC ................ 257/628; 438/150; 257/2; 257/296
(58) Field of Classification Search
    USPC ................. 257/2, 628, 296; 438/150
    See application file for complete search history.

(56) References Cited

U.S. PATENT DOCUMENTS

| | | | | |
|---|---|---|---|---|
| 5,888,853 A * | 3/1999 | Gardner et al. | ............... | 438/152 |
| 5,965,904 A * | 10/1999 | Ohtani et al. | ................... | 257/57 |
| 6,225,214 B1* | 5/2001 | Lin | ............................... | 438/629 |
| 6,329,258 B1* | 12/2001 | Inaba | ........................... | 438/305 |
| 6,870,224 B2* | 3/2005 | Kanda et al. | .................. | 257/345 |
| 2002/0196651 A1* | 12/2002 | Weis | ........................... | 365/100 |
| 2005/0040456 A1* | 2/2005 | Specht et al. | ................ | 257/315 |
| 2010/0213550 A1 | 8/2010 | Kanno et al. | | |
| 2011/0284817 A1* | 11/2011 | Sasago et al. | ..................... | 257/5 |

FOREIGN PATENT DOCUMENTS

JP    2009-21602 A    1/2009

OTHER PUBLICATIONS

U.S. Appl. No. 12/844,374, filed Jul. 27, 2010, Yoko Iwakaji, et al.
U.S. Appl. No. 12/873,604, filed Sep. 1, 2010, Yoko Iwakaji, et al.
U.S. Appl. No. 12/872,284, filed Aug. 31, 2010, Jun Hirota, et al.
U.S. Appl. No. 13/236,713, filed Sep. 20, 2011, Hirota, et al.

* cited by examiner

*Primary Examiner* — Jarrett Stark
*Assistant Examiner* — Nicholas Tobergte
(74) *Attorney, Agent, or Firm* — Oblon, Spivak, McClelland, Maier & Neustadt, L.L.P.

(57) ABSTRACT

According to one embodiment, a semiconductor device includes a plurality of silicon films. The plurality of silicon films are disposed on one plane and are made of polysilicon containing an impurity. A crystal orientation of each of the silicon films is a (311) orientation.

5 Claims, 8 Drawing Sheets

SEMICONDUCTOR DEVICE AND METHOD FOR MANUFACTURING THE SAME

CROSS-REFERENCE TO RELATED APPLICATIONS

This application is based upon and claims the benefit of priority from the prior Japanese Patent Application No. 2010-231911, filed on Oct. 14, 2010; the entire contents of which are incorporated herein by reference.

FIELD

Embodiments described herein relate generally to a semiconductor device and a method for manufacturing the same.

BACKGROUND

In recent years a phenomenon has been discovered in which certain metal oxide-based materials can have a low resistance state and a high resistance state when a voltage is applied, depending on the resistivity prior to application of the voltage and the magnitude of the applied voltage. Interest has been focused on new memory devices that use this phenomenon. This memory device is referred to as a Resistance Random Access Memory (ReRAM). A 3-dimensional cross-point structure has been proposed for the structure of an actual ReRAM device, in which memory cells are disposed at the intersection points of word lines (WL) and bit lines (BL), from the point of view of large scale integration.

In the 3-dimensional cross-point structure, when a voltage is applied to write data to a given memory cell, a voltage is also applied in an opposite direction to other memory cells which have not been selected. Consequently, it is necessary to provide each memory cell with a variable resistance film and a selection element film. For the selection element film, a silicon film with a pin type diode formed therein may, for example, be used.

In order to realize memory cell miniaturization while maintaining reliability and thereby increase the level of integration in a ReRAM structure of this type of structure, the characteristics of the selection element film are required to be favorable and uniform. Hence, it is necessary to form the silicon film using polysilicon, ensure that an impurity concentration profile in the silicon film is sharp, and ensure that a top surface is flat.

DETAILED DESCRIPTION

In general, according to one embodiment, a semiconductor device includes a plurality of silicon films. The plurality of silicon films are disposed on one plane and are made of polysilicon containing an impurity. A crystal orientation of each of the silicon films is a (311) orientation.

Various embodiments will be described hereinafter with reference to the accompanying drawings.

First, a first embodiment will be explained.

Figure 1:
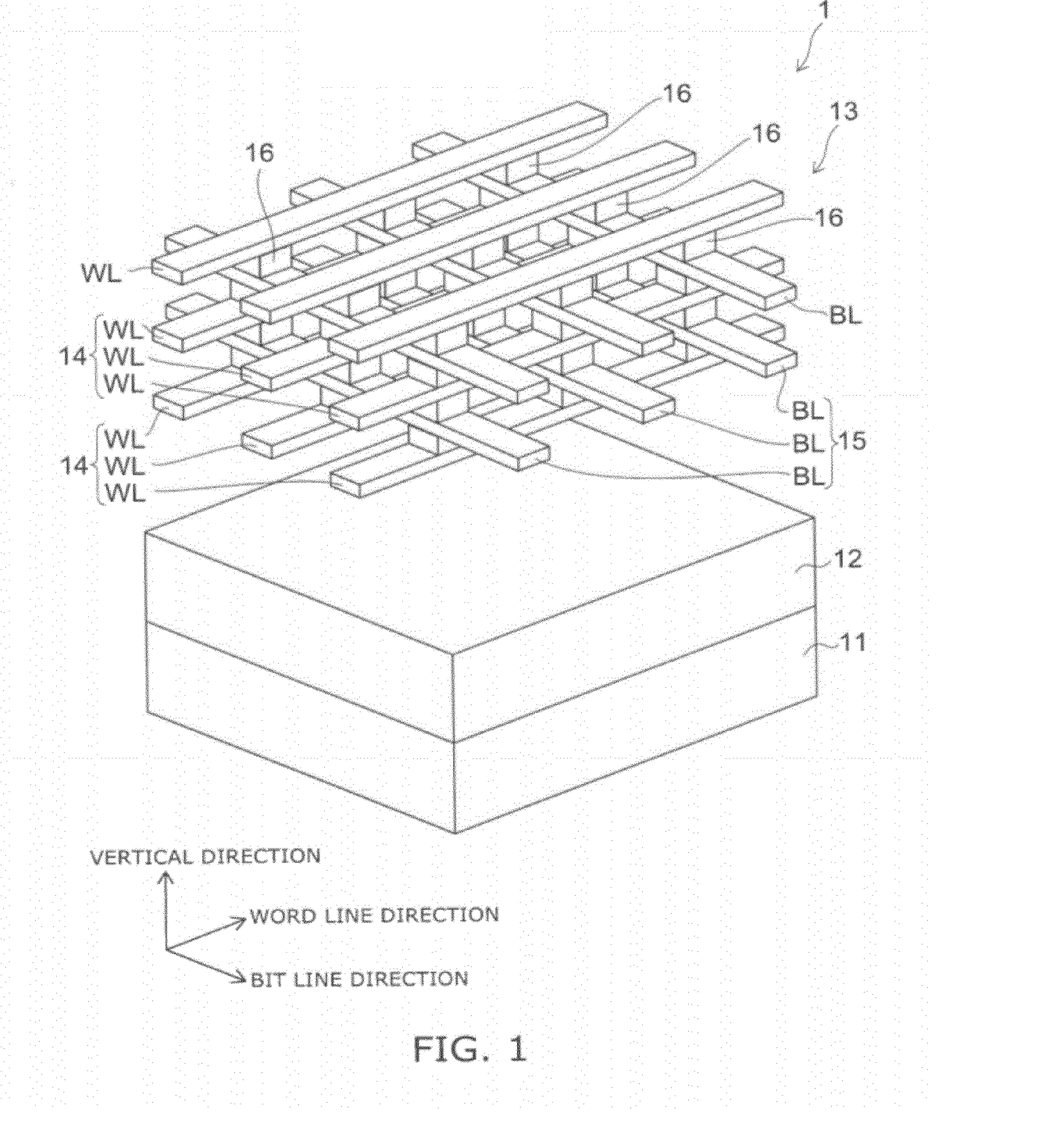
FIG. 1 is a perspective view illustrating a semiconductor device according to a first embodiment.

FIG. 1 is a perspective view illustrating a semiconductor device according to the embodiment.

Figure 2:
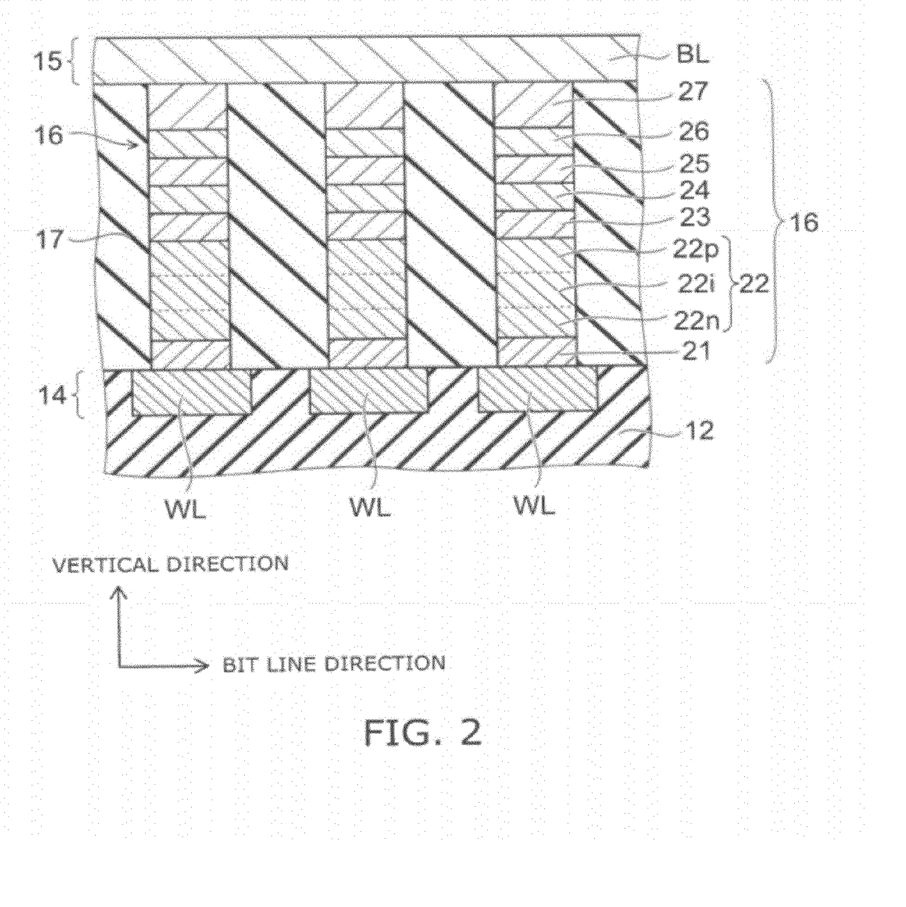
FIG. 2 is a cross-sectional view illustrating the semiconductor device according to the first embodiment.

FIG. 2 is a cross-sectional view illustrating the semiconductor device according to the embodiment.

Figure 3:
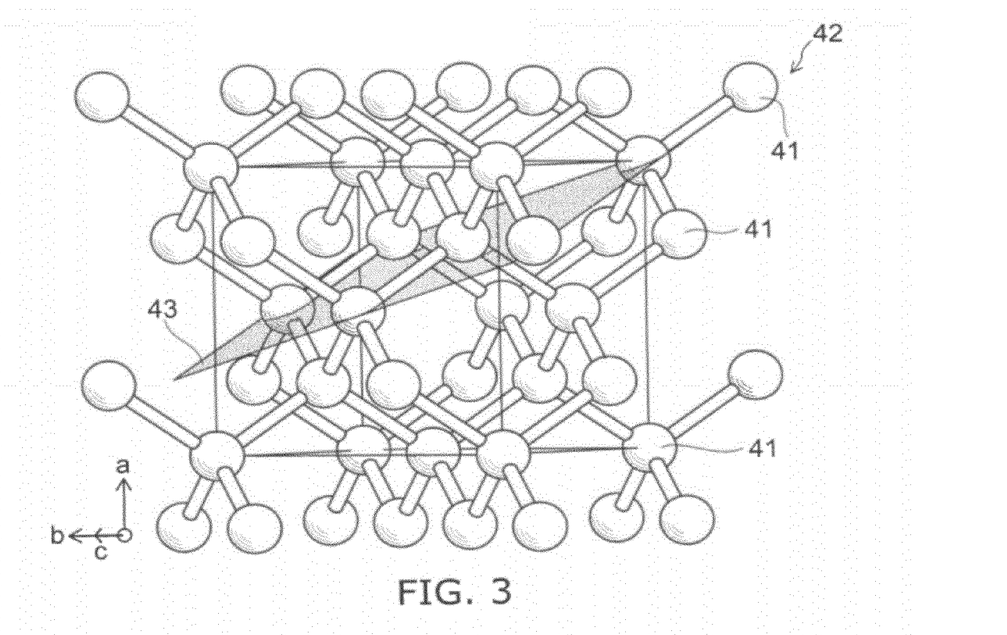
FIG. 3 is a molecular model diagram illustrating a (311) face of a silicon crystal.

FIG. 3 is molecular model diagram illustrating a (311) face of a silicon crystal.

The semiconductor device according to the embodiment is ReRAM.

As illustrated in FIG. 1, in a semiconductor device 1 according to the embodiment, a silicon substrate 11 is provided, and a drive circuit (not illustrated) of the semiconductor device 1 is formed on a top layer portion and a top surface of the silicon substrate 11. An inter-layer insulating film 12 formed from silicon oxide is, for example, provided on the silicon substrate 11 encapsulating the drive circuit, and a memory cell unit 13 is provided on the inter-layer insulating film 12.

In the memory cell unit 13, word line interconnect layer 14 formed from a plurality of word lines WL extending in a direction parallel to the top surface of the silicon substrate 11 (hereafter referred to as the "word line direction") and bit line interconnect layers 15 formed from a plurality of bit lines BL extending in a direction parallel to the top surface of the silicon substrate 11 and that intersect the word line direction at, for example, right angles (hereafter referred to as the "bit line direction") are stacked alternately, with insulating layers disposed therebetween. The word lines WL and the bit lines BL may, for example, be formed from tungsten (W). Also, there is no contact between word lines WL, between bit lines BL, or between word lines WL and bit lines BL.

Also, pillars 16 extending in the direction normal to the top surface of the silicon substrate 11 (hereafter referred to as the "vertical direction") are provided at the points of closest proximity between each word line WL and each bit line BL. The pillars 16 are formed between the word lines WL and the bit lines BL, and each memory cell is constituted from a single pillar 16. In other words, the semiconductor device 1 is a cross-point type device in which memory cells are disposed at each of the nearest neighbor of the word lines WL and the bit lines BL. An inter-layer insulating film 17 (see FIG. 2) formed from, for example, silicon oxide or the like is embedded between the word lines WL, the bit lines BL, and the pillars 16.

Hereinafter, a configuration of the pillar 16 will be explained with reference to FIG. 2.

There are two types of pillar 16; a first type in which the word line WL is disposed below the pillar and the bit line BL is disposed above the pillar, and a second type in which the word line WL is disposed above the pillar and the bit line BL is disposed below the pillar. FIG. 2 illustrates a pillar with the word line WL disposed below and the bit line disposed above. In this pillar 16, a lower electrode film 21, a silicon film 22, a silicide layer 23, a barrier metal layer 24, a variable resistance film 25, an upper electrode film 26 and a stopper film 27 are stacked subsequently from bottom (word line side) to top (bit line side). The lower electrode film 21 contacts the word line WL, and the stopper film 27 contacts the bit line BL.

Each film and each layer that constitutes the pillar 16 is described below.

The variable resistance film 25, which is formed, for example, from a metal oxide, may have at least two levels of low resistance value, and can be switched between resistance values by inputting a predetermined electrical signal. Hence, the variable resistance film 25 functions as a memory film.

The silicon film 22 is formed from polysilicon into which impurities such as boron (B) or phosphorus (P) is locally introduced and in which the impurity concentration varies along a film thickness direction. The silicon film 22 is a pin-type diode formed from a stack of layers subsequently including, from a lower layer side, an n-type layer 22n of an $n^+$-conductivity type, an i-type layer 22i formed from an intrinsic semiconductor, and a p-type layer 22p of a $p^+$-conductivity type. Hence, the silicon film 22 functions as a selection element film that only passes current when a higher potential is supplied by the bit line BL than the word line WL and prevents current flowing in an opposite direction. In the silicon film 22, a longitudinal direction of crystal grains is random, and a portion of the crystal grains contact the lower electrode film 21 and the silicide layer 23. Further, the crystal orientation of the silicon film 22 is a (311) orientation. More specifically, not less than 10% of the silicon crystal grains that forms the silicon film 22 is orientated with a (311) face facing upwards. Hence, as illustrated in FIG. 3, the silicon crystal grains have a diamond structure 42 formed from silicon atoms 41 with a (311) face 43 lying parallel to a top surface of the silicon film 22.

The lower electrode film 21 is a barrier film for suppressing a reaction between tungsten that forms the word line WL and silicon that forms silicon film 22, and may, for example, be formed from titanium nitride (TiN). The barrier metal layer 24 is a layer for preventing diffusion of the silicon that forms the silicon film 22 and of metal oxide that forms the variable resistance film 25, and for reducing a contact resistance between the silicon film 22 and the variable resistance film 25, and may, for example, be formed from titanium nitride (TiN). The silicide layer 23 is a layer that improves the adhesion characteristics between the silicon film 22 and the barrier layer 24, and is formed from titanium silicide (TiSi).

Note also that in the pillar 16 with the bit line BL disposed below and the word line WL disposed above, a stacked layer structure is the same as that of the pillar 16 with the word line WL disposed below, except in that the stacking order of the n-type layer 22n, the i-type layer 22i and the p-type layer 22p in the silicon film 22 is reversed. In the semiconductor device 1, the plurality of silicon films 22 belonging to each of the pillars 16 formed in each stage of the memory cell unit 13 are all disposed in the same plane.

Next, a method for manufacturing the semiconductor device according to the embodiment will be described.

Figure 4:
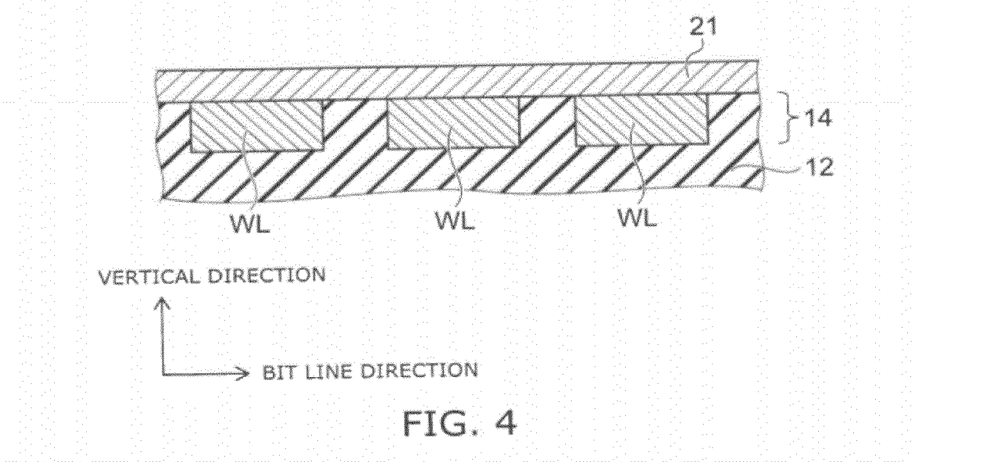
FIG. 4 is a process cross-sectional view illustrating a method for manufacturing the semiconductor device according to the first embodiment.

FIG. 4 is a process cross-sectional view illustrating the method for manufacturing the semiconductor device according to the embodiment.

FIGS. 5A to 5D are process cross-sectional views illustrating the method for manufacturing the semiconductor device according to the embodiment, and in particular, illustrating a film forming method for the silicon films.

Figure 6:
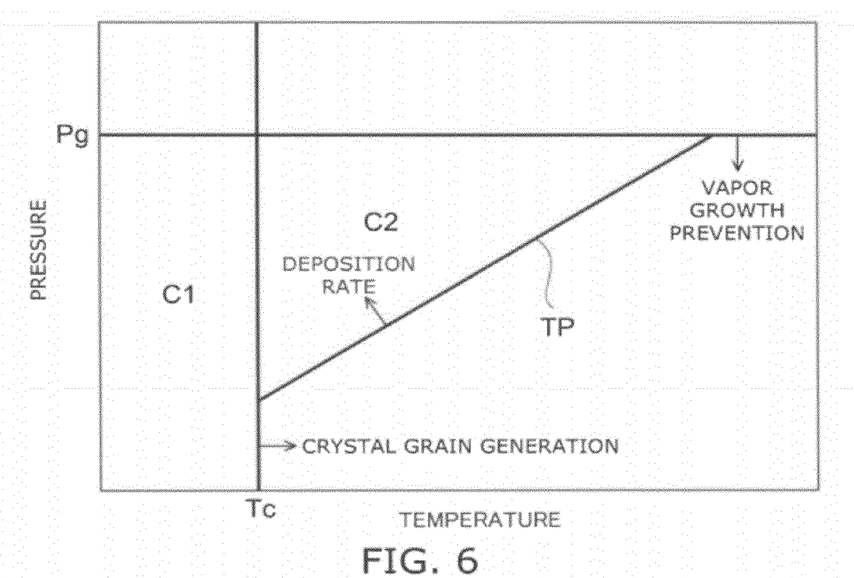
FIG. 6 is a graph schematically showing deposition conditions for each layer of the silicon films.

FIG. 6 is a graph schematically showing deposition conditions for each layer of the silicon film, with temperature plotted on a horizontal axis and pressure plotted on a vertical axis.

FIGS. 7 to 11 are process cross-sectional views illustrating the method for manufacturing the semiconductor device according to the embodiment.

First, as illustrated in FIG. 1, a drive circuit (not illustrated) for driving the memory cell unit 13 is formed on a top surface of the silicon substrate 11. Next, the inter-layer insulating film 12 is formed on the silicon substrate 11. Next, a contact that extends to the drive circuit is formed in the inter-layer insulating film 12.

Next, as illustrated in FIG. 4, tungsten is embedded in a top layer portion of the inter-layer insulating film 12 using, for example, a damascene method, and plurality of word lines WL are formed so as to extend parallel to each other in the word line direction. The word line interconnect layer 14 is formed by these word lines WL. Next, titanium nitride (TiN) is deposited to a thickness of, for example, approximately 5 to 10 nm on the word line interconnect layer 14 to form the lower electrode film 21.

Next, as illustrated in FIGS. 5A to 5D, the silicon film 22 is formed by depositing amorphous silicon on the lower electrode film 21 using, for example, low pressure chemical vapor deposition (LP-CVD). At this time, each of the impurities is introduced while depositing the amorphous silicon, to continuously form the n-type layer 22n, the i-type layer 22i, and the p-type layer 22p to form in the same chamber. A film forming method for the silicon film 22 is described in detail below.

Figure 5A:
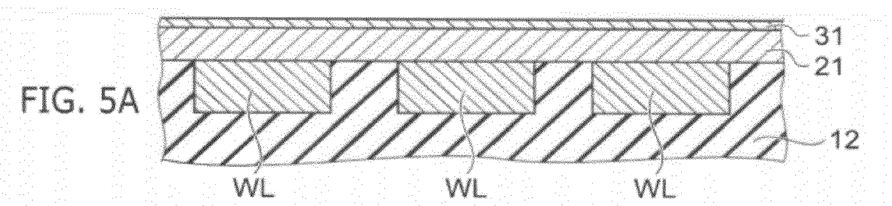
FIGS. 5A to 5D are process cross-sectional views illustrating the method for manufacturing the semiconductor device according to the embodiment, and in particular, illustrating a film forming method for the silicon films.

First, as illustrated FIG. 5A, the amorphous silicon is deposited without introducing impurities. At this point, generation of crystal grains is avoided. Hence, as shown as a condition C1 in FIG. 6, an oven temperature is set to be a lower than a temperature Tc, which is a lower limit for the generation of crystal grains. Moreover, an oven pressure is set to be lower than a pressure Pg, which is a lower limit for a vapor phase reaction. For example, a film may be formed to a thickness of 1 to 2 nm, using disilane ($Si_2H_6$) as the source gas, at a temperature of 400° C. and at a pressure of 100 to 150 Pa. As a result, a flat, non-doped amorphous silicon layer 31 is formed on a top surface. The non-doped amorphous silicon layer 31 is formed to prevent crystallinity in the lower electrode film 21 from affecting crystallinity in a phosphorus-doped amorphous silicon layer 32 that is formed later.

Figure 5B:
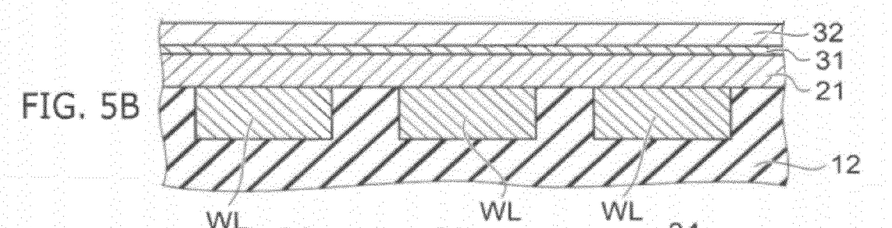

Next, as illustrated in FIG. 5B, amorphous silicon is deposited while introducing an impurity, such as phosphorus (P), which is to be a donor for the silicon. At this point, generation of crystal grains is avoided. Hence, the deposition condition is set to condition C1 shown in FIG. 6. In other words, a temperature is set to be lower than the temperature Tc, which is the lower limit for generating crystal grains, and a pressure is set to be lower than the pressure Pg, which is the lower limit for generating a vapor phase reaction. Note, however, that the deposition conditions are optimized with consideration for the effects of phosphorus. For example, a film may be formed using silane ($SiH_4$) and phosphine ($PH_3$) as the source gas, at a temperature of 500 to 550° C. and at a pressure of 130 to 180 Pa. As a result, a phosphorus-doped amorphous silicon layer 32 having a flat top surface is formed. Here, a phosphorus concentration in the phosphorus-doped amorphous silicon layer 32 is, for example, set from $1 \times 10^{20}$ to $1 \times 10^{21}$ $cm^{-3}$, and a thickness is, for example, set to 2 to 15 nm.

Figure 5C:
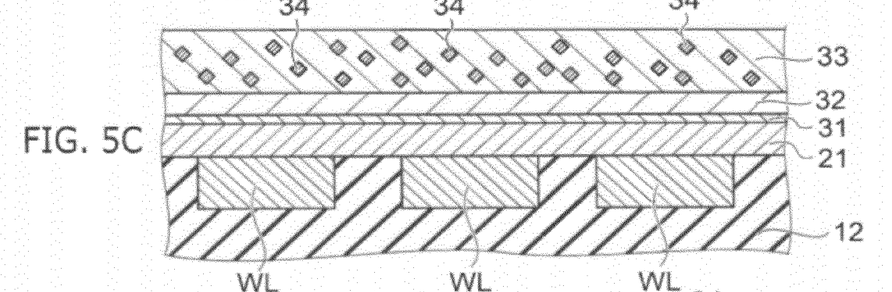

Next, as illustrated in FIG. 5C, silicon is deposited without introducing impurities. Here, as the amorphous silicon is deposited, silicon crystal grains are generated in the amorphous silicon. Note that a deposition rate of the amorphous silicon is set to be higher than a growth rate of the silicon crystal grains. Here, the deposition conditions are set to condition C2 shown in FIG. 6. In other words, in order to generate crystal grains, a temperature is set to be higher than the temperature Tc, which is the lower limit for generating crystal grains. Note that because the growth rate of the crystal grains increases with temperature and the deposition rate of the silicon increases with pressure, the pressure is set to be higher than a line TP that indicates temperatures and pressures at which the growth rate of the crystal grains and the deposition rate of the amorphous silicon are equal. Moreover, the pressure is set to be lower than a pressure Pg, which is a lower limit for a vapor phase reaction. Hence, as shown in FIG. 6, the condition C2 indicates a triangular region surrounded by a line expressing the temperature Tc, which is the lower limit for generating crystal grains; a line expressing the pressure Pg, which is the lower limit for a vapor phase reaction; and the line TP describing conditions for which the growth rate of the crystal grains and the deposition rate of the amorphous silicon are equal. Note also that FIG. 6 is a graph that shows boundary conditions of the condition C2 schematically. In reality, the lines are not limited to being straight lines, the temperature Tc may depend on pressure, and the pressure Pg may depend on temperature.

For example, a film may be formed using silane ($SiH_4$) as the source gas, at a temperature of 550 to 650° C. and at a pressure of 35 to 50 Pa. Accordingly, silicon crystal grains are formed in the amorphous silicon layer, the silicon crystal grains are embedded by subsequently deposited amorphous silicon and unevenness caused by the silicon crystal grains is flattened. As a result, fine silicon crystal grains 34 are embedded and a flat non-doped amorphous silicon layer 33 is formed on a top surface. A thickness of the non-doped amorphous silicon layer 33 is set to 50 to 120 nm, for example.

Figure 5D:
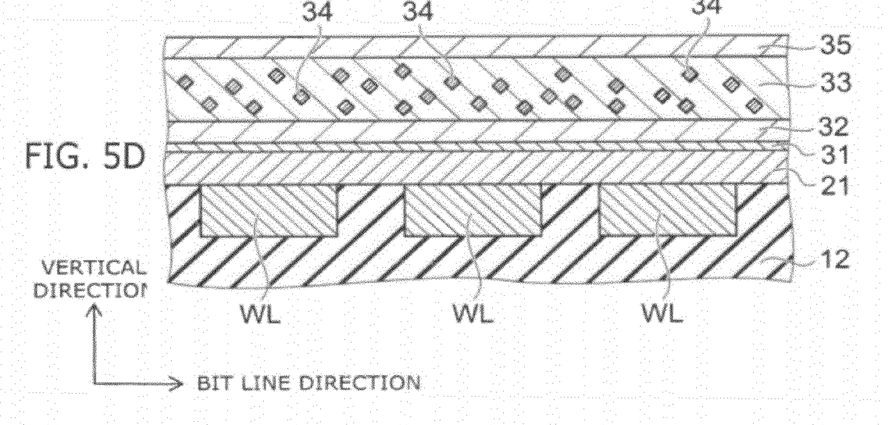

Next, as illustrated in FIG. 5D, amorphous silicon is deposited while introducing an impurity, such as boron (B), which is to be an acceptor for the silicon. At this point, generation of crystal grains is avoided. Hence, the deposition conditions are set to the condition C1 shown in FIG. 6 in the same way as in the processes illustrated in FIGS. 5A and 5B. Note, however, that the deposition conditions are optimized with consideration for the effects of boron. Specifically, because boron promotes decomposition of silane, the deposition rate is higher when depositing silicon while introducing boron than when depositing silicon while introducing phosphorus. Hence, the temperature is set lower than in the process illustrated in FIG. 5B. For example, a film may be formed using silane ($SiH_4$) and boron trichloride ($BCl_3$) as the source gas, at a temperature reduced to 400 to 500° C. and at a pressure of 100 to 150 Pa. As a result, a flat, boron-doped amorphous silicon layer 35 is formed on a top surface. A boron concentration in the boron-doped amorphous silicon layer 35 is, for example, set to $1 \times 10^{20}$ to $2 \times 10^{21}$ $cm^{-3}$, and a thickness is, for example, set to 2 to 15 nm.

Thus, the silicon layer 22 is formed by subsequently stacking the non-doped amorphous silicon layer 31, the phosphorus-doped amorphous silicon layer 32, the non-doped amorphous silicon layer 33 containing the silicon crystal grains 34, and the boron-doped amorphous silicon layer 35.

Figure 7:
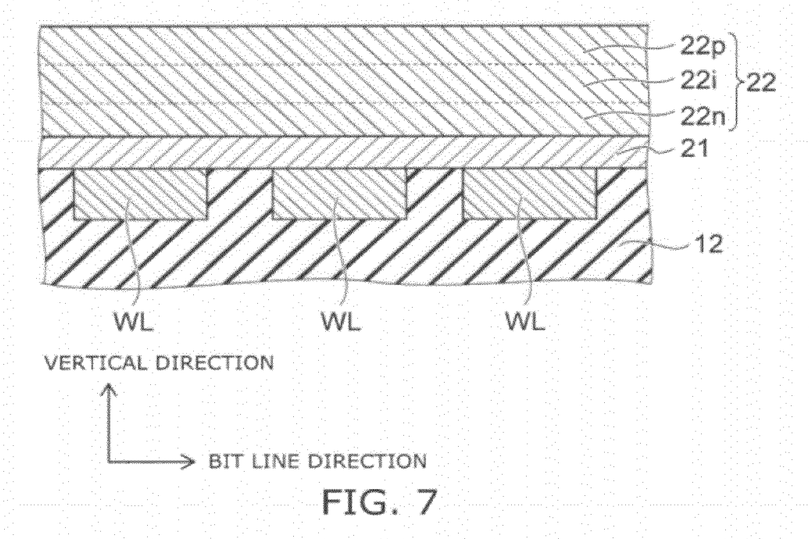
FIGS. 7 to 11 are process cross-sectional views illustrating the method for manufacturing the semiconductor device according to the first embodiment.

Next, as illustrated in FIG. 7, annealing is performed to crystallize the amorphous silicon forming the silicon film 22 by solid-phase growth and activating the impurities, which is to say the phosphorus and the boron, included in the silicon film 22. For example, a temperature of 700 to 900° C. may be maintained for 30 to 80 seconds. Consequently, a bottom layer portion of the silicon film 22, which contains the phosphorus, becomes the n-type layer $22n$ of the $n^+$-conductivity type; a middle layer portion, which substantially having no impurities, becomes the i-layer $22i$ of the i conductivity type, and a top layer portion, which contains the boron, becomes the p-type layer 22 of the $p^+$-conductivity type. At this point, the silicon film 22 crystallizes with the silicon crystal grains 34 in the non-doped amorphous silicon layer 33 as nuclei to form a polycrystalline structure. Moreover, the crystallized silicon film 22 takes on the (311) orientation.

Figure 8:
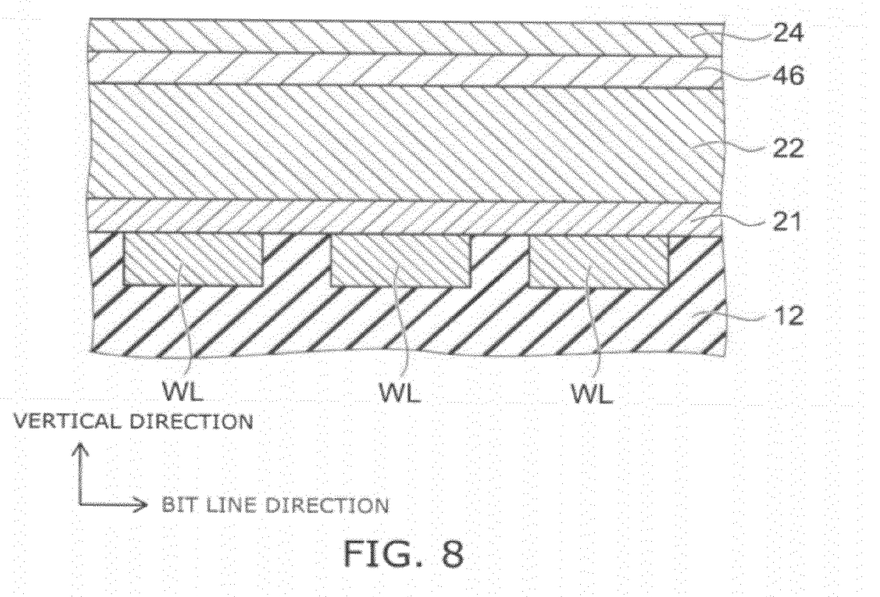

Next, as illustrated in FIG. 8, a thin metal layer 46 is formed on the silicon film 22. A material of the metal layer 46 is preferably a metal for which an absolute value of a reduction in Gibbs free energy or generated heat at a time of an oxidization reaction is larger than those of silicon. A natural oxidation film formed on the top surface of the silicon film 22 can then be deoxidized. For example, the material of the metal layer 46 is preferably titanium (Ti), tantalum (Ta), niobium (Nb), hafnium (Hf), zirconium (Zr) or chromium (Cr). Alternatively, the material may be an alloy including the metals and tungsten (W), which has a high melting point. A thickness of the metal layer 46 is preferably approximately 0.5 to 2.0 nm, for example. Next, the barrier metal layer 24 is formed on the metal layer 46. The barrier metal layer 24 is formed, for example, using titanium nitride (TiN), and the thickness is set to, for example, approximately 10 nm.

Figure 9:
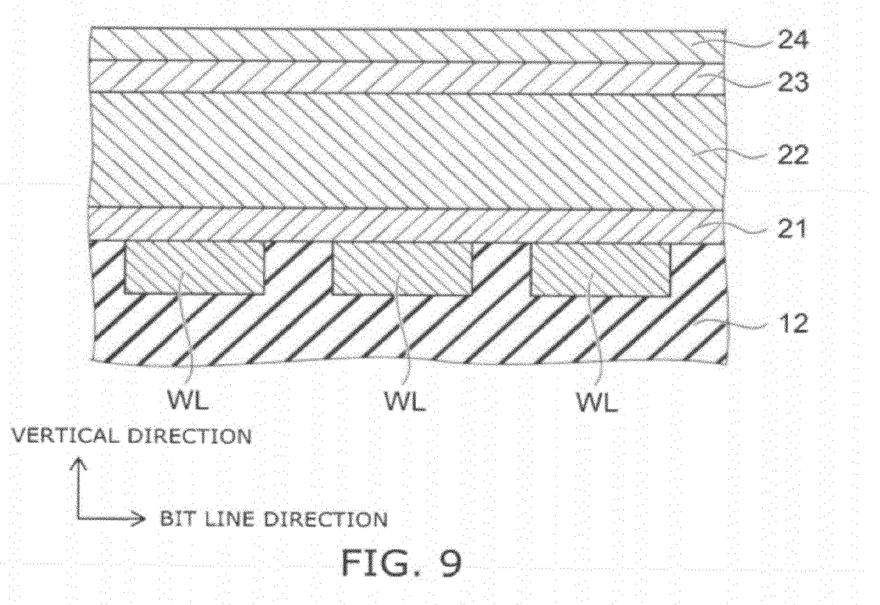

Next, as illustrated in FIG. 9, annealing is performed to cause a reaction between the silicon contained in the silicon film 22 and the metal contained in the metal layer 46 (see FIG. 8). A temperature of the annealing is, for example, 500 to 700° C. As a result, the metal layer 46 disappears (see FIG. 8) and a silicide layer 23 is formed between the silicon film 22 and the barrier metal layer 24.

Figure 10:
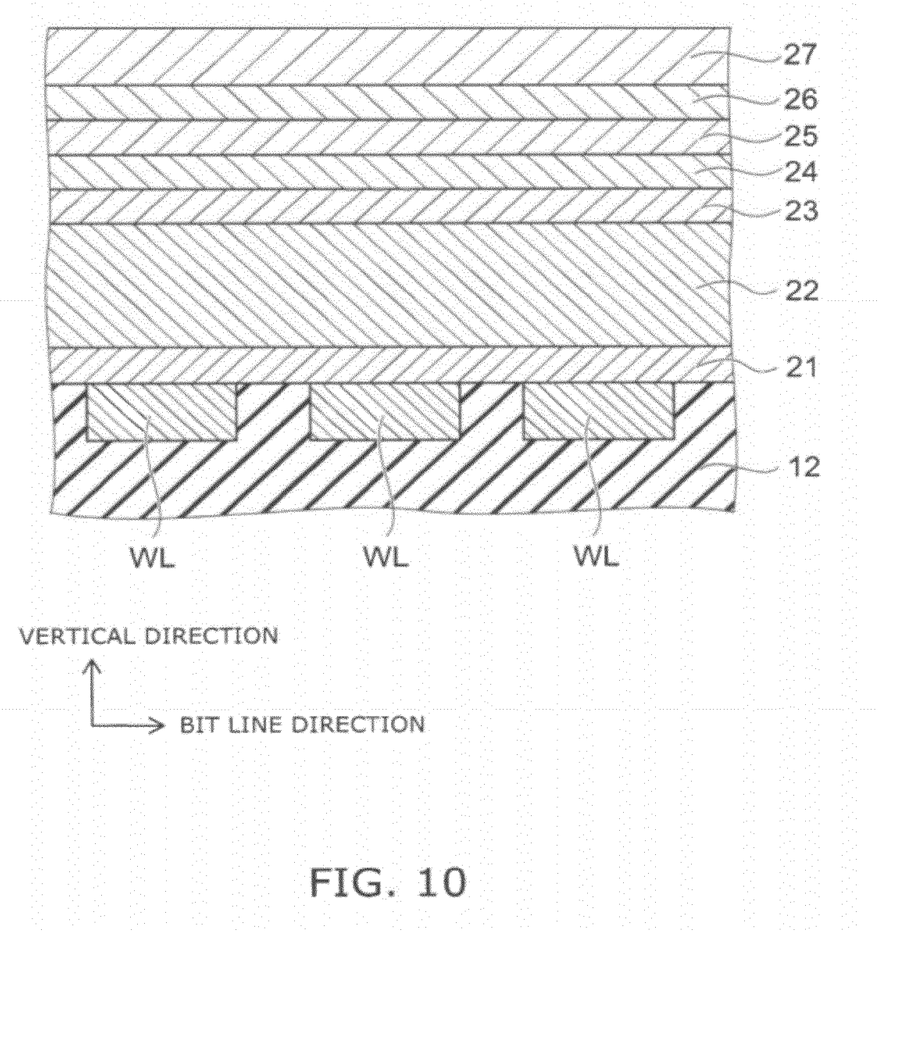

Next, as illustrated in FIG. 10, a metal oxide is deposited to form the variable resistance film 25. Next, an upper electrode film 26 is formed. Next, tungsten is deposited to form the stopper film 27.

Figure 11:
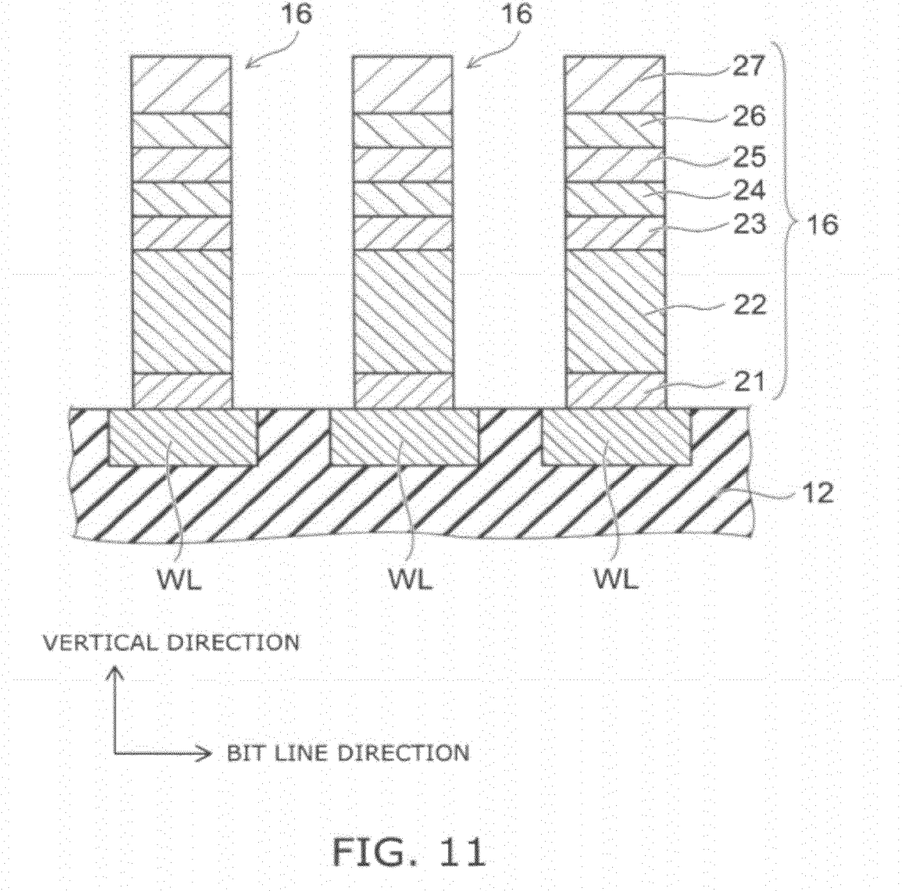

Next, as illustrated in FIG. 11, a silicon oxide film is formed by a chemical vapor deposition (CVD) method using tetra ethyl ortho silicate (TEOS) as the source material, and a hard mask (not illustrated) is subsequently formed by forming a silicon nitride film. Next, pattering is performed on the hard mask using a lithography method. Next, reactive ion etching (RIE) is performed with the patterned hard mask as a mask. As a result, the stopper film 27, the upper electrode film 26, the variable resistance film 25, the barrier metal layer 24, the silicide layer 23, the silicon film 22 and the lower electrode film 21 are selectively removed to form the pillars 16. An aspect ratio of the pillar 16 is, for example, not less than 4.

Next, as illustrated in FIG. 2, an insulating film is, for example, formed so as to embed between the pillars 16. For example, a silicon oxide film may be deposited using a CVD method with TEOS as a source material. Next, a chemical mechanical polishing (CMP) method is performed using the stopper film 27 as a stopper to flatten a top surface of the silicon oxide film. As a result, the inter-layer insulating film 17 made of silicon oxide is formed between the pillars 16. At this point, the upper electrode film 26 is exposed at a top surface of the inter-layer insulating film 17.

Next, a further inter-layer insulating film (not illustrated) is formed on the inter-layer insulating film 17, and the plurality of bit lines BL are formed using a damascene method. The bit line interconnect layer 15 is formed using a plurality of bit lines BL. Each bit line BL is connected to the top surfaces of the plurality of pillars 16 arranged in the bit line direction. As a result, each of the pillars 16 is formed between the word line WL and the bit line BL and is connected to the word line and the bit line.

Next, pillars 16 are formed on the bit lines BL. When forming the pillars 16, the order of stacking of the n-type layer $22n$, the i-type layer $22i$ and the p-type layer $22p$ in the silicon film 22 is reversed with respect to the pillar 16 formed on the word lines WL.

Thus, after forming the lower electrode film 21, amorphous silicon is deposited without introducing impurities, using the condition C1 (see FIG. 6). At this point, generation of crystal grains is avoided. For example, a film thickness of 1 to 2 nm may be deposited using disilane ($Si_2H_6$) as the source gas, at a temperature of approximately 400° C. and at a pressure of 100 to 150 Pa. As a result, a non-doped amorphous silicon layer is formed.

Next, amorphous silicon is deposited while introducing, for example, boron (B) using the condition C1. At this point, generation of crystal grains is avoided. For example, a film is deposited to a thickness of 2 to 15 nm, using silane ($SiH_4$) and boron trichloride ($BCl_3$) as the source gas, at a temperature of 400 to 500° C. and at a pressure of 100 to 150 Pa. As a result, a boron-doped amorphous silicon layer is formed.

Next, silicon is deposited without introducing impurities, using the condition C2. Here silicon crystal grains are generated while depositing the amorphous silicon and the deposition rate of the amorphous silicon is set to be higher than the growth rate of the silicon crystal grains. For example, the amorphous silicon is deposited to a thickness of 50 to 120 nm using silane ($SiH_4$) as the source gas, at a temperature of 550 to 650° C. and at a pressure of 35 to 50 Pa. As a result, the fine silicon crystal grains are embedded and a flat, non-doped amorphous silicon layer is formed on a top surface.

Next, amorphous silicon is deposited while introducing, for example, phosphorous (P) using the condition C1. At this point, generation of crystal grains is avoided. For example, the amorphous silicon is deposited to a thickness of 2 to 15 nm, using silane ($SiH_4$) and phosphine ($PH_3$) as the source gas, at a temperature of 500 to 550° C. and at a pressure of 130 to 180 Pa. As a result, a phosphorus-doped amorphous silicon layer is formed. Thus, the silicon film 22, which is mainly formed from amorphous silicon and has silicon crystal grains embedded in a central portion of the film thickness, is formed.

Thereafter, annealing is performed to crystallize the amorphous silicon formed in the silicon film 22 and activate the impurities. Next, the silicide layer 23 is formed by depositing the metal layer 46 and the barrier metal layer 24 and annealing. Next, the variable resistance film 25, the upper electrode film 26 and the stopper film 27 are subsequently formed. Next, these layers are selectively removed by RIE to form the pillar 16. Next, the gaps between the pillars 16 are filled with the inter-layer insulating film 17. In this way, the plurality of pillars 16 are formed on the bit line interconnect layer 15.

Thereafter, the word line interconnect layer 14, the plurality of pillars 16, the bit line interconnect layer 15, and the plurality of pillars 16 are repeatedly formed by the same method. As a result, the semiconductor device 1 having the cross-point structure is manufactured.

Next, the effects of the embodiment will be described.

In the embodiment, amorphous silicon is deposited when forming the silicon film 22, and subsequently crystallized. By depositing the amorphous silicon, the top surface of the silicon film 22 can be made flat. As a result, characteristics of the pin-type diode formed in each of the silicon films 22 can be made favorable, the film thickness of the silicon film 22 between the pillars 16 can be made approximately equal, and characteristics of the selection element film can be made uniform. Moreover by crystallizing the silicon film 22 by solid-phase growth, the silicon film 22 can be given a polycrystalline structure while maintaining a smoothness of the top surface. As a result, the degree of movement of carriers in the silicon film 22 is increased, and a pin type diode with excellent characteristics can be obtained.

Moreover, in the embodiment, the crystal orientation of the silicon film 22 is set to the (311) orientation. As a result, it is easier to increase the crystal grain size of the silicon film 22, and to keep the top surface of the silicon film 22 flat. By increasing the crystal grain size, a density of the crystal grain boundary can be reduced, and it becomes more difficult for impurities to diffuse via the crystal grain boundary. By flattening the top surface of the silicon film 22, variation in the characteristics of the pin type diode is reduced.

Then, in the embodiment, in the process of forming the non-doped amorphous silicon layer 33 illustrated in FIG. 5C, silicon crystal grains are generated as the amorphous silicon is deposited, and the deposition rate of the amorphous silicon is set higher than the growth rate of the silicon crystal grains. Hence, silicon crystal grains 34 are embedded in the non-doped amorphous silicon layer 33. Hence, when performing annealing in the process illustrated in FIG. 7, the silicon crystal grains 34 form nuclei and the silicon film 22 can be easily crystallized. Hence, the annealing to achieve crystallization can be low-temperature, short-time scale annealing, and the diffusion of impurities associated with annealing can be suppressed. As a result, sharpness can be maintained in the impurity concentration profile within the silicon film 22, and an effective thickness of the i-type layer 22i can be maintained at a thick level. Consequently, in the pin type diode formed in the silicon film 22, the forward direction current can be increased and the reverse direction current suppressed. In other words, rectifying characteristics of the pin-type diode can be favorably maintained.

By contrast, if the silicon crystal grains 34 are not formed in the silicon film 22, high-temperature annealing over a long period is required to crystallize the silicon film 22. In particular, when the silicon film 22 is made thin to increase a level of integration of the semiconductor device 1, a density of crystal nuclei per unit area decreases. Hence, to reliably crystallize the entire silicon film 22, annealing for a longer period at a higher temperature is required. As a result, amounts of the phosphorus introduced in the phosphorus-doped amorphous silicon layer 32 and of the boron introduced in the boron-doped amorphous silicon layer 35 that diffuse in the non-doped amorphous silicon layer 33 increase, and the effective thickness of the i-type layer 22i is reduced. Consequently, in the pin-type diode formed in the silicon film 22, a reverse direction breakdown voltage drops and a reverse direction current increases, thereby degrading the rectifying characteristics.

Note that a method by which a film forming temperature for the silicon film 22 is set higher and polysilicon is formed directly on the lower electrode film 21 is also considered. However, in this case, the deposited silicon may locally cluster and increase unevenness on the top surface of silicon film 22. As a result, the characteristics of the pin type diode become non-uniform, and device integration is difficult. It is then difficult to miniaturize the pillar 16. To flatten the top surface of the silicon film 22, a process by which the silicon film 22 is formed using amorphous silicon that is not subsequently crystallized may further be considered. In this case, however, the characteristics of the silicon film 22 as a semiconductor worsen, and a performance of the pin type diode will be unsatisfactory. A process by which, subsequent to depositing the amorphous silicon, a metal such titanium is deposited to form a silicide and the silicon film 22 is crystallized with the silicide as the crystal nuclei may further be considered. In this case, however, although it is possible lower the crystallization temperature, a diffusion rate of the metal atoms is higher in the amorphous silicon than in the polysilicon. Consequently, unreacted metal atoms diffuse in the silicon film 22 and the reverse direction characteristics of the pin-type diode are degraded.

In the embodiment, on the other hand, the silicon film 22 crystallizes with the silicon crystal grains 34 as nuclei, and so directions of longitudinal axes of the crystal grains are random in the silicon film 22a after the crystallization. As a result, diffusion of impurities along crystal grain boundaries in a film thickness direction is difficult. Consequently, sharpness in the impurity concentration profile along the film thickness direction can be maintained, and the characteristics of the pin-type diode can be made favorable. By contrast, in the case that the silicon film 22 is formed by growing polysilicon directly on the lower electrode film 21, crystal grains of the polysilicon of the silicon film 22 form pillar-like structures extending in the film thickness direction (vertical direction), and the crystal grain boundaries also extend in the film thickness direction. This in turn makes it easier for impurities to diffuse in the film thickness direction via the crystal grain boundaries. Hence, the impurity concentration profile along the film thickness direction broadens, and the characteristics of the pin-type diode deteriorate.

Further, according to the embodiment, the silicon crystal grains 34 are embedded in the amorphous silicon when depositing the i-type layer 22i. Because the i-type layer 22i is formed without introducing impurities, it is difficult for crystallization to proceed. Consequently control of the generation of the silicon crystal grains 34 and of the suppression of growth is simple. Moreover, since the silicon crystal grains 34 are embedded in a central portion of the film thickness direction of the silicon film 22, it is easier to crystallize the entire silicon film 22.

In addition, in the embodiment, since the silicon film 22 has already been crystallized when forming the metal layer 46, diffusion in the silicon layer 22 of the metal forming the metal layer 46 can be suppressed.

In addition, in the embodiment, since the selection element is formed by the pin type diode, costs are low.

Next a second embodiment will be described.

In the first embodiment, the deposition and crystallization of the silicon film 22 were performed in separate processes. However, in the embodiment, the crystallization of the silicon film 22 is completed in film forming process of the silicon film 22.

The following is a detailed description. In processes illustrated in FIG. 5A and FIG. 5B, the non-doped amorphous silicon layer 31 and the phosphorus-doped amorphous silicon layer 32 are formed using the same conditions as in the first embodiment.

Next, in the process illustrated in FIG. 5C, silicon is deposited using temperature which is within the boundaries of the condition C2 (see FIG. 6) but a little higher than the temperature used in the first embodiment. For example, silicon may be deposited using an oven temperature of not less than 600° C. Accordingly, the non-doped amorphous silicon layer 33 and the silicon crystal grains 34 are simultaneously formed with the growth rate of the silicon crystal grains 34 set to be close to the deposition rate of the non-doped amorphous silicon layer 33. As a result, crystallization of the non-doped amorphous silicon layer with the silicon crystal grains 34 as nuclei proceeds simultaneously with the deposition of the non-doped amorphous silicon layer 33. Crystallization with the silicon crystal grains 34 as nuclei also proceeds in the previously formed phosphorus-doped amorphous silicon layer 32 and the non-doped amorphous silicon layer 31.

Thereafter, when the boron-doped amorphous silicon layer 35 is deposited in the process illustrated in FIG. 5D, crystallization is performed as the boron-doped amorphous silicon layer 35 is being deposited. Thus, in the film forming process of the silicon film 22, nearly all of the amorphous silicon is crystallized.

According to the embodiment, the crystallization process illustrated in FIG. 7 can be omitted. The configuration, manufacturing method and effect of the embodiment other than that described above is the same as the first embodiment as described previously.

Next, a third embodiment will be described.

The embodiment differs from the first embodiment in that an impurity diffusion layer constitutes a top layer portion of the silicon film 22 is formed by ion-implantation.

Thus, as illustrated in FIGS. 5A to 5C, when forming the silicon film 22 that is formed on the word lines WL, the non-doped amorphous silicon layer 31 and the phosphorus-doped amorphous silicon layer 32 are deposited and the non-doped amorphous silicon layer 33 including the silicon crystal grains 34 is deposited. The impurity that is to become the acceptor with respect to the silicon which is boron (B) or indium (In) or the like, is then ion-implanted on the top layer portion of the non-doped amorphous silicon layer 33 without depositing boron-doped amorphous silicon layer 35 (see FIG. 5D). Thereafter, as illustrated in FIG. 7, annealing is performed to crystallize the silicon and activate the impurities. As a result, the portion of the non-doped amorphous silicon layer 33 in which the acceptor is implanted becomes the p-type layer 22p, thereby forming the silicon film 22.

When forming the silicon film 22 that is formed on bit lines BL, the non-doped amorphous silicon layer and boron-doped amorphous silicon layer are deposited and the non-doped amorphous silicon layer including the silicon crystals is then deposited. The impurity that is to become the donor with respect to the silicon which is phosphorus (P) or arsenic (As) or the like, is then ion-implanted on the top layer portion of the non-doped amorphous silicon layer without depositing the phosphorus-doped amorphous silicon layer. Thereafter, annealing is performed to crystallize the silicon and activate the impurities. As result, the portion of the non-doped amorphous silicon layer 33 in which the donor is implanted becomes the n-type layer 22n, thereby forming the silicon film 22.

According to the embodiment, the deposition process of the amorphous silicon illustrated in the FIG. 5D can be omitted. The configuration, manufacturing method and effect of the embodiment other than that described above is the same as the first embodiment as described previously.

Next, a fourth embodiment will be described.

The embodiment differs from the first embodiment in that the annealing to crystallize the silicon and activate the impurities is not performed after each forming of the pillars 16 but all at once after manufacturing the cross-point structure. Accordingly, the number of annealing can be reduced, and thermal histories of the silicon film layers 22 disposed in a lower portion of memory cell unit 13 (see FIG. 1) and the silicon film layers 22 disposed in an upper portion can be matched. In other words, increased diffusion due to the increased number of annealing undergone by the silicon films 22 formed first can be suppressed.

In the embodiment, the silicon crystal grains 34 are formed in the silicon film 22. Hence, in the process illustrated in FIG. 11, each silicon film 22 can reliably contain crystal nuclei even after processing the pillar 16 by cutting the silicon films 22 and the like using RIE. As a result, in subsequent processing, each of the silicon films 22 can be reliably crystallized.

By contrast, if the silicon crystal nuclei 34 was not formed in the silicon films 22, the probability of silicon crystal nuclei existing in the pillars 16 after processes would be lower, making it difficult to reliably crystallize the silicon film 22 in all of the pillars 16. In particular, when the pillars 16 are made finer to promote high-level integration of the semiconductor device, this tendency becomes particularly marked. The configuration, manufacturing method and effect of the embodiment other than that described above is the same as the first embodiment as described previously.

Next, a fifth embodiment will be described.

A semiconductor device according to the embodiment differs in that a metal-insulator-semiconductor (MIS) type diode is provided in place of the pin type diode as the selection element in each pillar 16.

A manufacturing method of the MIS type diode is described below. For example, a boron-doped amorphous silicon layer is deposited at a temperature of 420 to 550° C. and the temperature of the oven then is increased to 550 to 650° C. to form a non-doped amorphous silicon layer containing silicon crystal grains. Next, an insulating film of silicon dioxide ($SiO_2$) or the like is formed. Then, an electrode film as titanium nitride (TiN) film or the like is deposited. Thereafter, annealing is performed to crystallize the amorphous silicon and activate the boron.

Thus, even in the case that the selection element is realized using a diode other than a pin type diode, if a portion or all of the diode is formed using polysilicon, silicon crystal grains can be embedded in the amorphous silicon layers to make subsequent crystallization simple. The configuration, manufacturing method and effect of the embodiment other than that described above is the same as the first embodiment as described previously.

In the above-described first to fourth embodiments, the silicon crystal grains 34 are formed in the non-doped amorphous silicon layer 33, which is positioned in a central portion of the film thickness direction of the silicon film 22. As described above, such an arrangement has the merit of making control of the deposition conditions simple. However, the invention is not limited to this configuration and the silicon crystal grains 34 may be formed in any portion of the silicon film 22. For example, the silicon crystal grains 34 may be formed in the phosphorus-doped amorphous silicon layer 32, the boron-doped amorphous silicon layer 35, or the silicon crystal grains 34 may be formed in a portion of the non-doped amorphous silicon layer 33 in the film thickness direction.

In each of the above-described embodiments, examples are described in which the selection element is formed as a pin type diode or MIS type diode. However, the invention is not limited to this configuration, and any device formed partially or entirely from a polycrystalline semiconductor material is acceptable. For example, the selection element may be a transistor. Note also that the semiconductor material is not limited to silicon.

Further, in each of the above-described embodiments, an example is described in which the semiconductor device is a ReRAM. However, the invention is not limited to this configuration, and the semiconductor device may include a plurality of semiconductor films disposed in the same plane and formed from a polycrystalline semiconductor material containing impurities.

According to the above-described embodiments, it is possible to realize a semiconductor device that is formed using polysilicon and has a sharp impurity concentration profile and a flat top surface, and a method for manufacturing the same.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising a plurality of silicon films disposed on one plane and made of polysilicon containing an impurity,
    a crystal orientation of each of the silicon films is a (311) orientation,
    the device further comprising:
        a first interconnect layer formed of a plurality of first interconnects extending in a first direction parallel to a top surface of the silicon films; and
        a second interconnect layer formed of a plurality of second interconnects extending in a second direction intersecting the first direction,
        the first interconnect layer and the second interconnect layer being stacked alternately, and
        each of the silicon films being disposed between each of the first interconnects and each of the second interconnects.

2. The device according to claim 1, wherein an impurity concentration in each of the silicon films varies along a film thickness direction.

3. The device according to claim 1, wherein each of the silicon films is a diode or a part of a diode.

4. A semiconductor device comprising a plurality of silicon films disposed on one plane and made of polysilicon containing an impurity,
    a crystal orientation of each of the silicon films is a (311) orientation,
    further comprising a memory film stacked on each of the silicon films.

5. The device according to claim 4, wherein the memory film is a variable resistance film.

* * * * *